United States Patent
Hong et al.

(10) Patent No.: US 11,201,160 B2
(45) Date of Patent: Dec. 14, 2021

(54) SEMICONDUCTOR MEMORY DEVICE INCLUDING MULTIPLE CONDUCTIVE LINE LAYERS

(71) Applicant: Samsung Electronics Co., Ltd., Suwon-si (KR)

(72) Inventors: Hee Bum Hong, Hwaseong-si (KR); Yongrae Cho, Anyang-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 16/454,765

(22) Filed: Jun. 27, 2019

(65) Prior Publication Data

US 2020/0168617 A1    May 28, 2020

(30) Foreign Application Priority Data

Nov. 28, 2018   (KR) .................... 10-2018-0149652

(51) Int. Cl.
*H01L 27/11* (2006.01)
*G11C 5/14* (2006.01)
*G11C 11/412* (2006.01)

(52) U.S. Cl.
CPC ............ *H01L 27/1116* (2013.01); *G11C 5/14* (2013.01); *H01L 27/1104* (2013.01); *G11C 11/412* (2013.01)

(58) Field of Classification Search
CPC .. H01L 27/11; H01L 27/1116; H01L 27/1104; G11C 5/14; G11C 11/412; G11C 5/063; G11C 8/14
See application file for complete search history.

(56) References Cited

U.S. PATENT DOCUMENTS

| | | | |
|---|---|---|---|
| 5,334,863 A * | 8/1994 | Ohkawa | H01L 27/1108 257/393 |
| 6,606,276 B2 | 8/2003 | Yamauchi et al. | |
| 7,355,873 B2 | 4/2008 | Nii et al. | |
| 7,940,542 B2 | 5/2011 | Funane et al. | |
| 8,421,205 B2 | 4/2013 | Yang | |
| 9,620,510 B2 | 4/2017 | Liaw | |
| 9,704,564 B2 | 7/2017 | Liaw | |
| 2004/0000686 A1* | 1/2004 | Houston | H01L 27/10852 257/306 |
| 2005/0093071 A1* | 5/2005 | Wu | H01L 24/06 257/355 |
| 2017/0110461 A1 | 4/2017 | Fujiwara et al. | |
| 2017/0154671 A1* | 6/2017 | Liaw | H01L 27/0207 |
| 2017/0301394 A1 | 10/2017 | Liaw | |

* cited by examiner

*Primary Examiner* — Sheng-Bai Zhu

(57) ABSTRACT

Disclosed is a semiconductor memory device comprising a plurality of memory cells each including an access transistor, a pull-up transistor, and a pull-down transistor on a substrate, a first line layer on the memory cells and including a first lower landing pad and a second lower landing pad, a second line layer on the first line layer and including a ground line having an opening and an upper landing pad in the opening, and a third line layer including a word line on the second line layer. The ground line is electrically connected through the first lower landing pad to a terminal of the pull-down transistor. The word line is electrically connected through the upper landing pad and the second lower landing pad to a terminal of the access transistor.

14 Claims, 12 Drawing Sheets

SEMICONDUCTOR MEMORY DEVICE INCLUDING MULTIPLE CONDUCTIVE LINE LAYERS

CROSS-REFERENCE TO RELATED APPLICATION

This U.S. nonprovisional application claims priority under 35 U.S.C § 119 to Korean Patent Application No. 10-2018-0149652 filed on Nov. 28, 2018 in the Korean Intellectual Property Office, the entire contents of which are hereby incorporated by reference.

BACKGROUND

Some example embodiments of some inventive concepts relate to a semiconductor memory device, and more particularly, to a semiconductor memory device including a plurality of memory cells.

Semiconductor devices are beneficial in electronic industry because of their small size, multi-functionality, and/or low fabrication cost. Examples of semiconductor devices include semiconductor memory devices storing logic data, semiconductor logic devices processing operations of logic data, and hybrid semiconductor devices having both memory and logic elements. Semiconductor devices have been increasingly integrated with the advanced development of the electronic industry. For example, semiconductor devices have been increasingly requested that exhibit characteristics such as high reliability, high speed, and/or multi-functionality. Semiconductor devices have been gradually complicated and integrated to meet these requested characteristics.

SUMMARY

According to some example embodiments of some inventive concepts, a semiconductor memory device may include a plurality of memory cells on a substrate, each of the plurality of memory cells including an access transistor and a pull-down transistor; a first line layer on the memory cells, the first line layer including a first lower landing pad and a second lower landing pad; a second line layer on the first line layer, the second line layer including a ground line having an opening and an upper landing pad in the opening; and a third line layer including a word line on the second line layer. The ground line may be electrically connected through the first lower landing pad to a terminal of the pull-down transistor. The word line may be electrically connected through the upper landing pad and the second lower landing pad to a terminal of the access transistor.

According to some example embodiments of some inventive concepts, a semiconductor memory device may include a plurality of memory cell transistors on a substrate; a first line layer on the memory cell transistors; and a second line layer on the first line layer. The second line layer may include a ground line having a plurality of openings and having electrical connection through the first line layer to a terminal of a first memory transistor of the memory cell transistors. The ground line may include a pair of first segments that extend in a second direction and a pair of second segments that extend in a first direction intersecting the second direction. Each of the openings may be defined by the pair of the first segments and the pair of second segments. A width in the first direction of each first segment of the pair of first segments may be greater than a width in the second direction of each second segments in the pair of the second segments.

According to some example embodiments of some inventive concepts, a semiconductor memory device may include a plurality of memory cells on a substrate, each of the memory cells including a plurality of memory transistors; and a first line layer, a second line layer, and a third line layer sequentially stacked on the memory cells. The first line layer may include a bit line, a power line, and a first lower landing pad. The second line may include a ground line and an upper landing pad. The third line layer may include a word line. The word line may be electrically connected through the upper landing pad and the first lower landing pad to a terminal of a first memory transistor of the memory transistors.

DETAILED DESCRIPTION OF SOME EXAMPLE EMBODIMENTS

Figure 1:
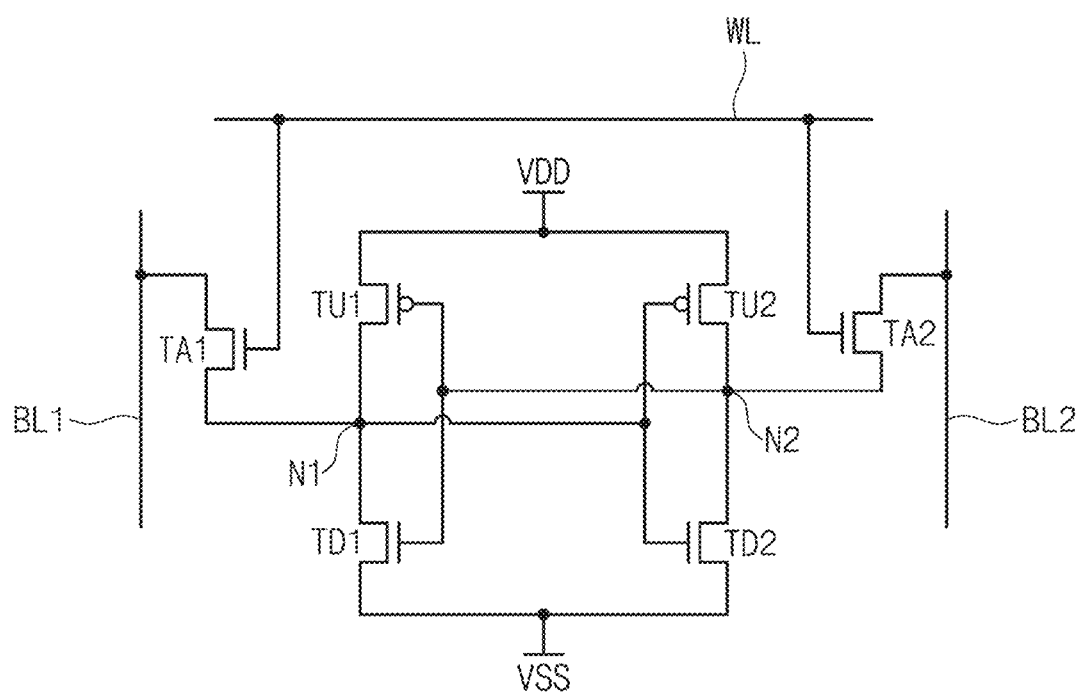
FIG. 1 illustrates an example circuit diagram showing an SRAM cell according to some example embodiments of some inventive concepts.

FIG. 1 illustrates an example circuit diagram showing an example SRAM cell according to some example embodiments of some inventive concepts.

In some example embodiments such as shown in FIG. 1, a static random access memory (SRAM) cell may include a first pull-up transistor TU1, a first pull-down transistor TD1, a second pull-up transistor TU2, a second pull-down transistor TD2, a first access transistor TA1, and/or a second access transistor TA2. In some example embodiments, the first and second pull-up transistors TU1 and TU2 may be PMOS and/or NMOS transistors. The first and second pull-down transistors TD1 and TD2 and the first and second access transistors TA1 and TA2 may be NMOS transistors.

In some example embodiments, a first node N1 may be connected to a first source/drain of the first pull-up transistor TU1 and/or a first source/drain of the first pull-down transistor TD1. A power line VDD may be connected to a second source/drain of the first pull-up transistor TU1, and a ground line VSS may be connected to a second source/drain of the first pull-down transistor TD1. The first pull-up transistor TU1 and the first pull-down transistor TD1 may have their gates electrically connected to each other. In some example embodiments, the first pull-up transistor TU1 and the first pull-down transistor TD1 may function together as a first inverter. The first inverter may have an input terminal corresponding to the connected gates of the first pull-up and pull-down transistors TU1 and/or TD1, and/or may have an output terminal corresponding to the first node N1.

In some example embodiments, a second node N2 may be connected to a first source/drain of the second pull-up transistor TU2 and/or a first source/drain of the second pull-down transistor TD2. The power line VDD may be connected to a second source/drain of the second pull-up transistor TU2, and/or the ground line VSS may be connected to a second source/drain of the second pull-down transistor TD2. The second pull-up transistor TU2 and the second pull-down transistor TD2 may have their gates electrically connected to each other. The second pull-up transistor TU2 and the second pull-down transistor TD2 may therefore function together as a second inverter. The second inverter may have an input terminal corresponding to the connected gates of the second pull-up and pull-down transistors TU2 and TD2, and/or have an output terminal corresponding to the second node N2.

In some example embodiments, first and second inverters may be connected to each other to function as a latch structure. In this configuration, the gates of the first pull-up and pull-down transistors TU1 and TD1 may be electrically connected to the second node N2, and/or the gates of the second pull-up and pull-down transistors TU2 and TD2 may be electrically connected to the first node N1. The first access transistor TA1 may have a first source/drain connected to the first node N1 and/or a second source/drain connected to a first bit line BL1. The second access transistor TA2 may also have a second source/drain connected to the second node N2 and/or a second source/drain connected to a second bit line BL2. The first and/or second access transistors TA1 and TA2 may have their gates electrically connected to a word line WL. The configuration above may function as an SRAM cell according to some example embodiments of some inventive concepts.

Figure 2:
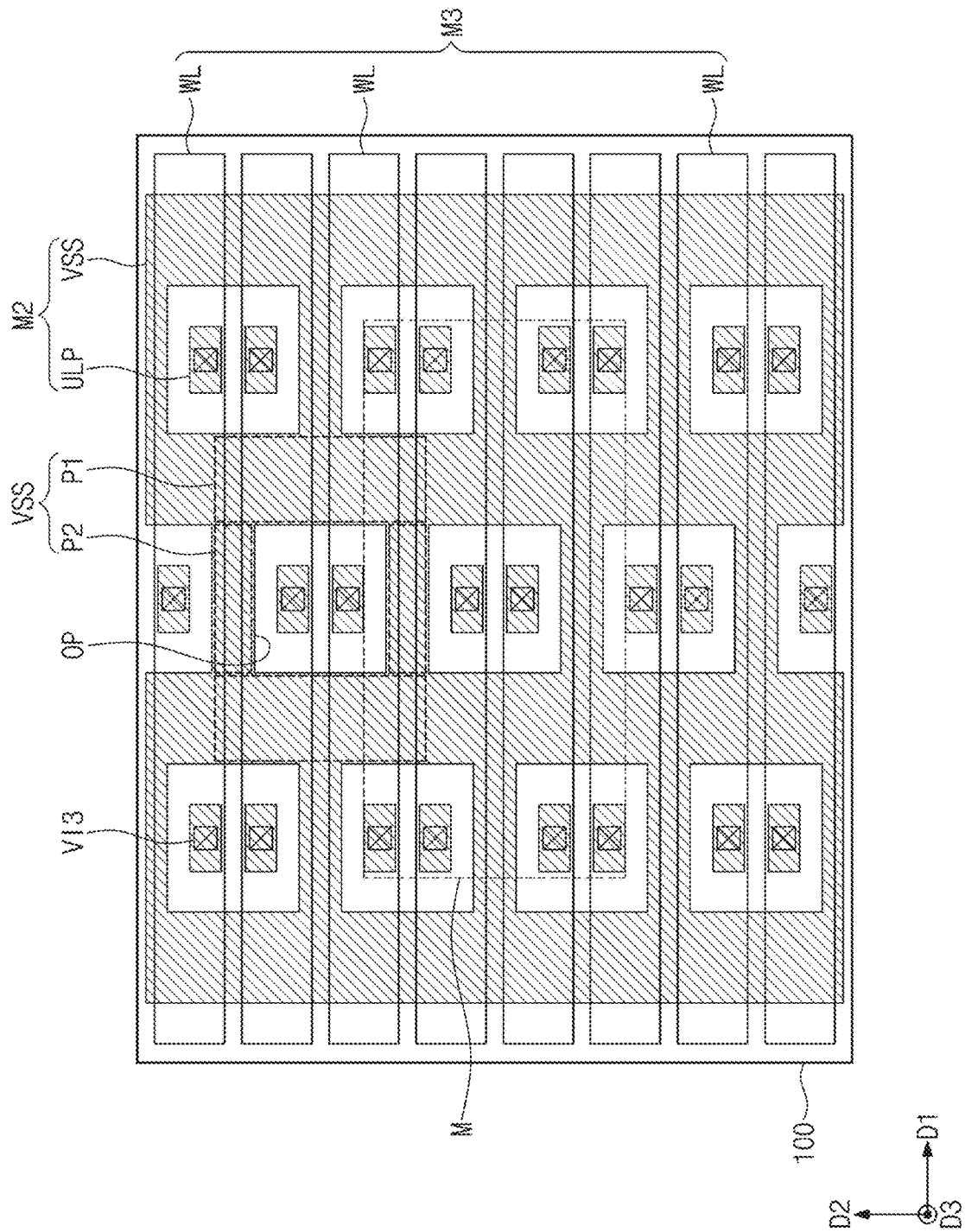
FIG. 2 illustrates a plan view showing line layers of an example semiconductor memory device according to some example embodiments of some inventive concepts.
Figure 3:
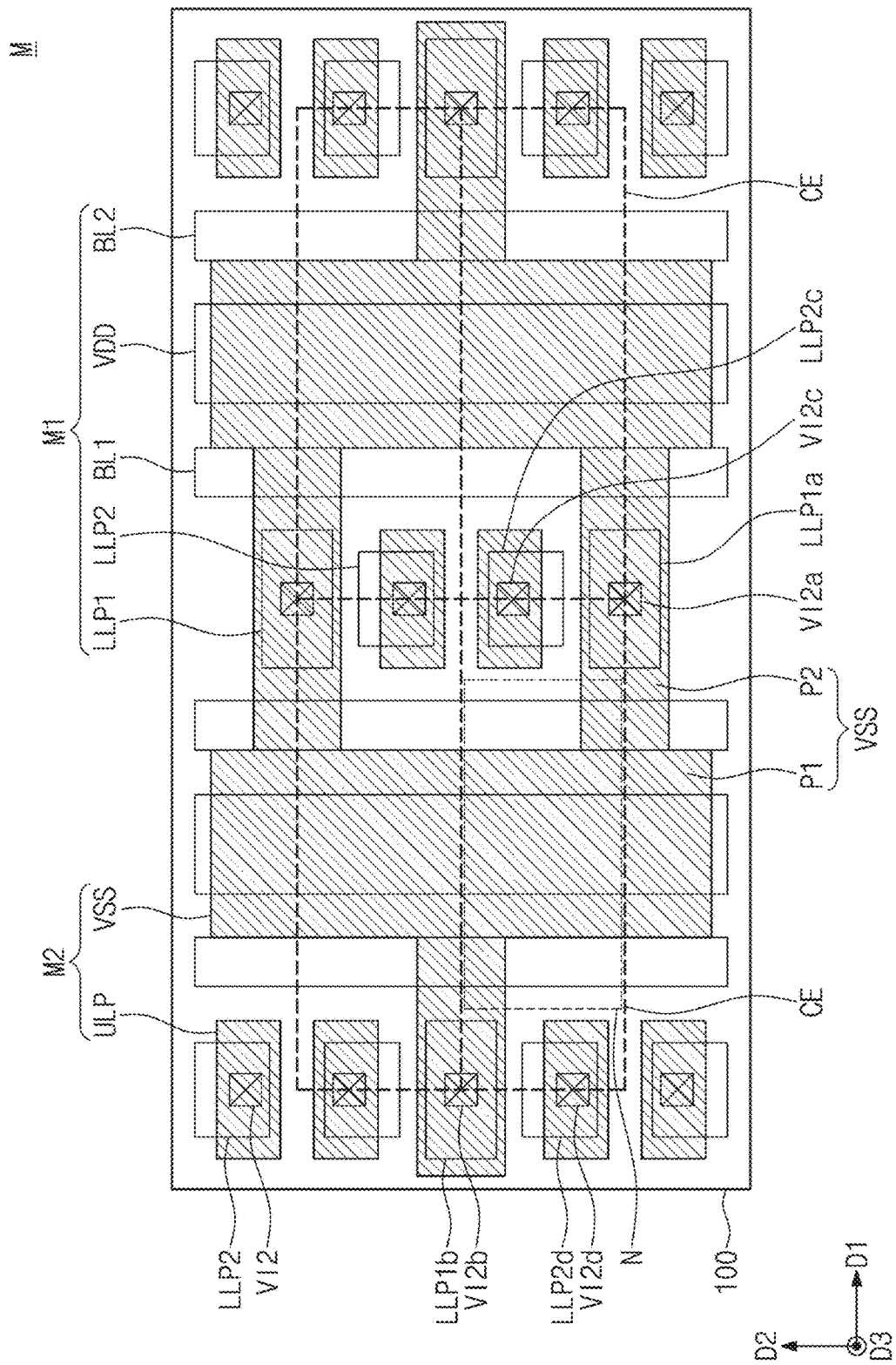
FIG. 3 illustrates an example of an enlarged plan view showing section M of FIG. 2.
Figure 4:
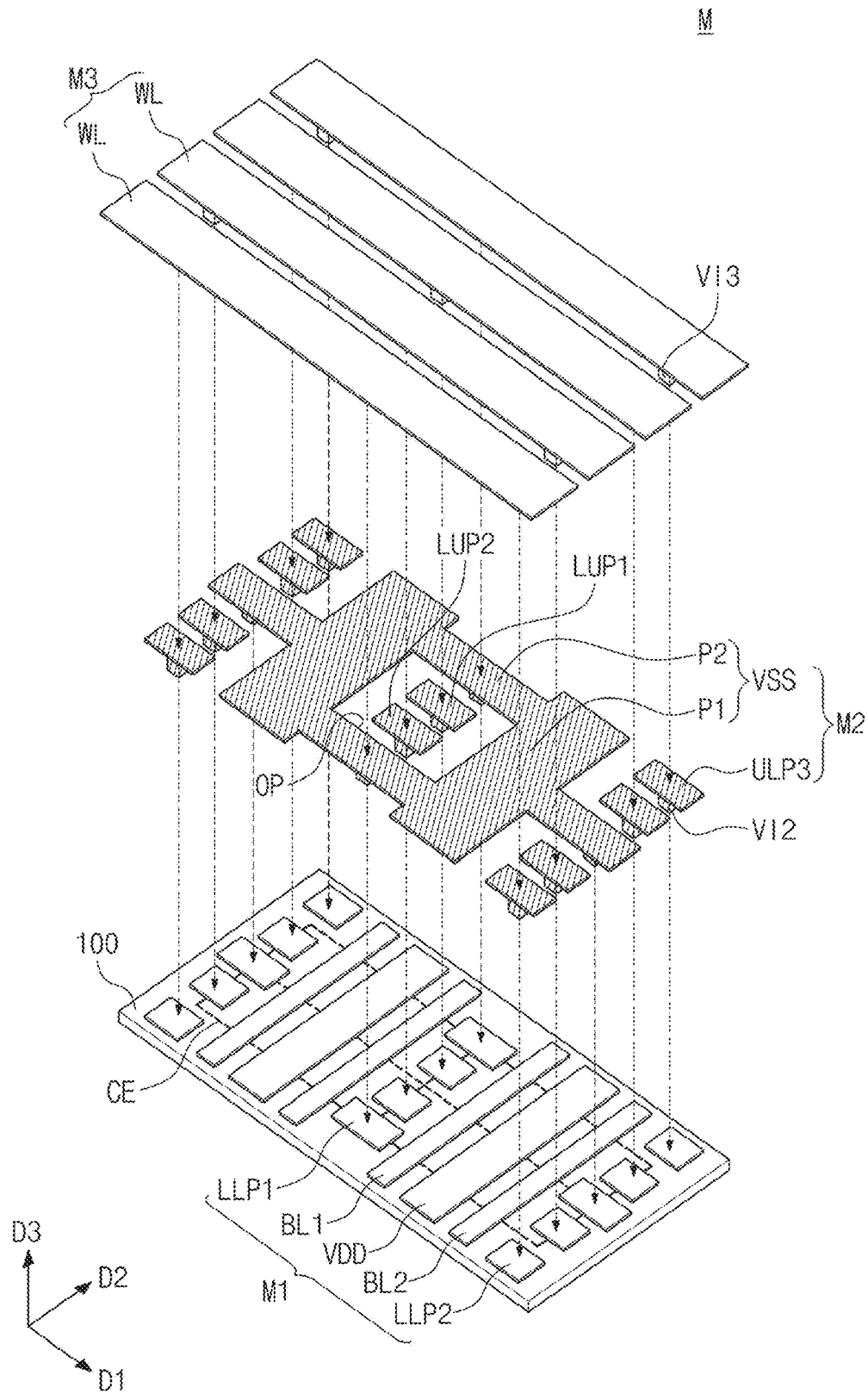
FIG. 4 illustrates a simplified perspective view showing an example section M of FIG. 2.

FIG. 2 illustrates a plan view showing line layers of a semiconductor memory device according to some example embodiments of some inventive concepts. FIG. 3 illustrates an enlarged plan view showing an example section M of FIG. 2. FIG. 4 illustrates a simplified perspective view showing an example section M of FIG. 2.

In some example embodiments such as shown in FIGS. 2 to 4, a plurality of memory cells CE may be provided on a substrate 100. The memory cells CE may be arranged two-dimensionally on the substrate 100. In some example embodiments, each of the memory cells CE may be the SRAM cell discussed above with reference to FIG. 1. The memory cells CE may be provided thereon with a first line layer M1, a second line layer M2, and a third line layer M3. The first, second, and third line layers M1, M2, and M3 may be sequentially stacked. The first, second, and third line layers M1, M2, and/or M3 may include one or more of conductive metal nitride (e.g., titanium nitride or tantalum nitride) and metal (e.g., titanium, tantalum, tungsten, copper, or aluminum).

In some example embodiments such as shown in FIGS. 3 and 4, a first line layer M1 may include a first bit line BL1, a second bit line BL2, and/or a power line VDD that extend in a second direction D2. The power line VDD may be interposed between the first bit line BL1 and/or the second bit line BL2. The first bit line BL1, the second bit line BL2, and/or the power line VDD may have a linear shape when viewed in plan. The power line VDD may have a width in a first direction D1 greater than a width in the first direction D1 of the first bit line BL1 and/or the second bit line BL2.

In some example embodiments, a first line layer M1 may include a first lower landing pad LLP1 and/or a second lower landing pad LLP2 that are adjacent to the first bit line BL1 and/or the second bit line BL2. The first and second lower landing pads LLP1 and LLP2 may be arranged along the second direction D2. The first and/or second lower landing pads LLP1 and LLP2 may have an island shape when viewed in plan.

In some example embodiments, a first line layer M1 may include first vias (e.g., VI1 of FIG. 5), which may be correspondingly provided below the first bit line BL1, the second bit line BL2, the power line VDD, the first lower landing pad LLP1, and/or the second lower landing pad LLP2. The first vias VI1 may electrically connect the memory cells CE to the first line layer M1.

In some example embodiments such as shown in FIGS. 2 to 4, a second line layer M2 may include a ground line VSS and/or an upper landing pad ULP. The ground line VSS may be a mesh-typed conductive structure. For example, the ground line VSS may have a plurality of openings OP, and/or may extend in the first and second directions D1 and D2. The ground line VSS may include a first segment P1 extending in the second direction D2 and/or a second segment P2 extending in the first direction D1. The first segment P1 may have a width in the first direction D1 that is greater than a width of the second segment P2 in the second direction D2. The opening OP may be defined by a pair of neighboring first segments P1 and a pair of neighboring second segments P2.

In some example embodiments, a pair of the upper landing pads ULP may be disposed in the opening OP. The pair of the upper landing pads ULP may be arranged in the second direction D2 in the opening OP. The upper landing pads ULP may have an island shape when viewed in plan.

In some example embodiments, one or more of the second segments P2 of the ground line VSS may, respectively, vertically overlap one or more of the first lower landing pads LLP1. At least a portion of the second segment P2 of the ground line VSS may vertically overlap a first lower landing pad LLP1 therebelow. One or more of the upper landing pads ULP may, respectively, vertically overlap one or more of the second lower landing pads LLP2. At least a portion of the upper landing pad ULP may vertically overlap a second lower landing pad LLP2 therebelow.

In some example embodiments, a second line layer M2 may include one or more second vias VI2 that are correspondingly provided below the ground line VSS and/or the upper landing pad ULP. The ground line VSS may be electrically connected through the second via VI2 to the first lower landing pad LLP1 of the first line layer M1. Because the second via VI2 is provided in plural below the ground line VSS, a plurality of the first lower landing pads LLP1 may be connected in common to a single ground line VSS. The upper landing pad ULP may be electrically connected through the second via VI2 to the second lower landing pad LLP2 of the first line layer M1.

In some example embodiments, a second line layer M2 may include the ground line VSS, the upper landing pads ULP, and/or the second vias VI2. In some example embodiments, a second line layer M2 may be limited to such structures; for example, a second line layer M2 may be limited to the ground line VSS. In some other example embodiments, a second line layer M2 may include other lines, such as a bit line, power line, and/or word line.

In some example embodiments, a third line layer M3 may include word lines WL extending in the first direction D1. The word lines WL may be arranged in the second direction D2. The word lines WL may have a linear shape when viewed in plan.

In some example embodiments, a third line layer M3 may include third vias VI3 below the word lines WL. The word line WL may be electrically connected through the third via VI3 to the upper landing pad ULP of the second line layer M2. For example, the word line WL may be electrically connected through the third via VI3, the upper landing pad ULP, and the second via VI2 to the second lower landing pad LLP2 of the first line layer M1.

In some example embodiments, a third line layer M3 may include word lines WL and/or third vias VI3. In some example embodiments, a third line layer M3 may include only the word line WL. In some other example embodiments, a third line layer M3 may include other lines, such as a bit line, power line, and/or ground line.

Figure 5:
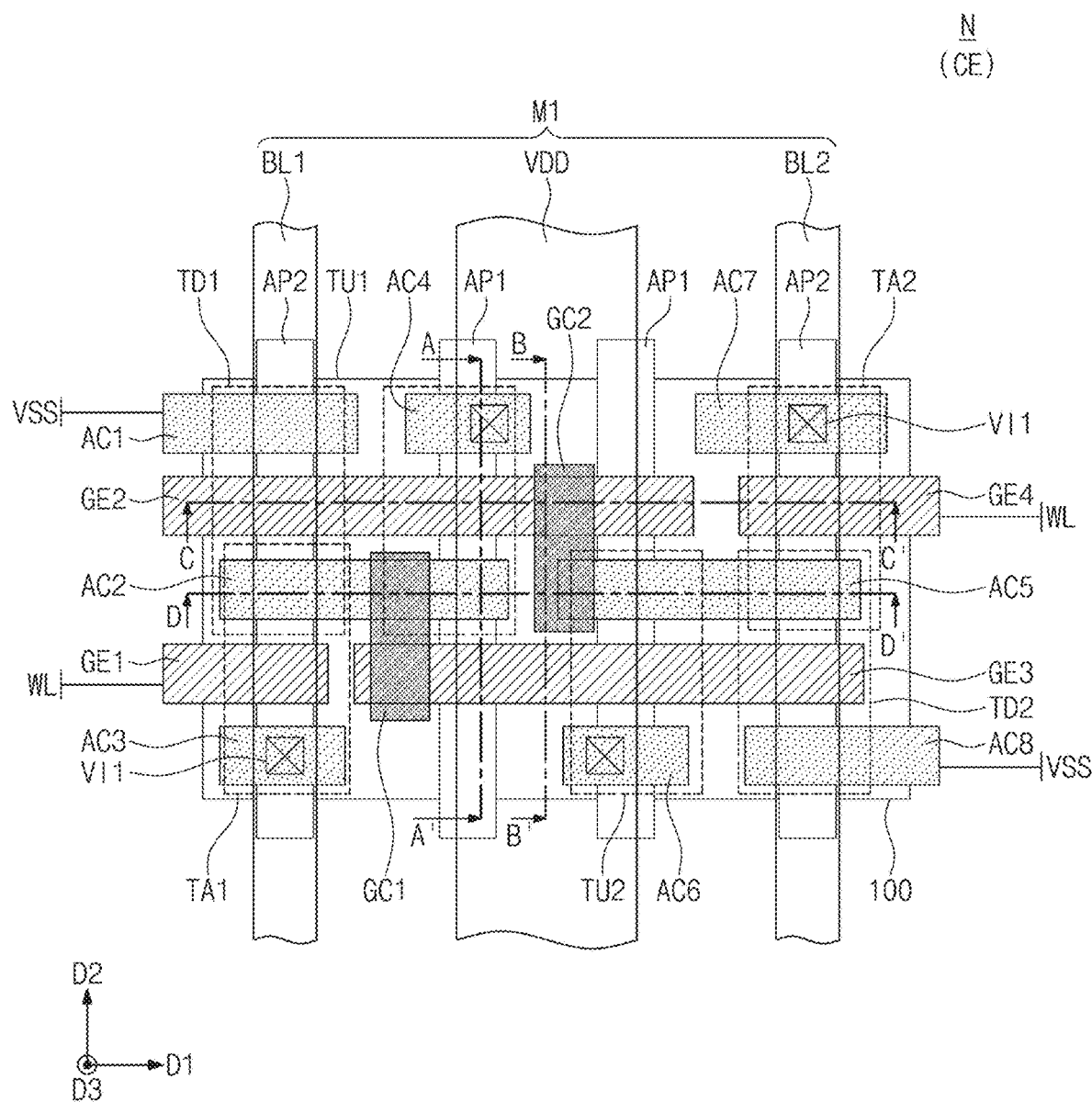
FIG. 5 illustrates an enlarged plan view of an example section N depicted in FIG. 3, including an example SRAM according to the example circuit diagram of FIG. 1.
Figure 6A:
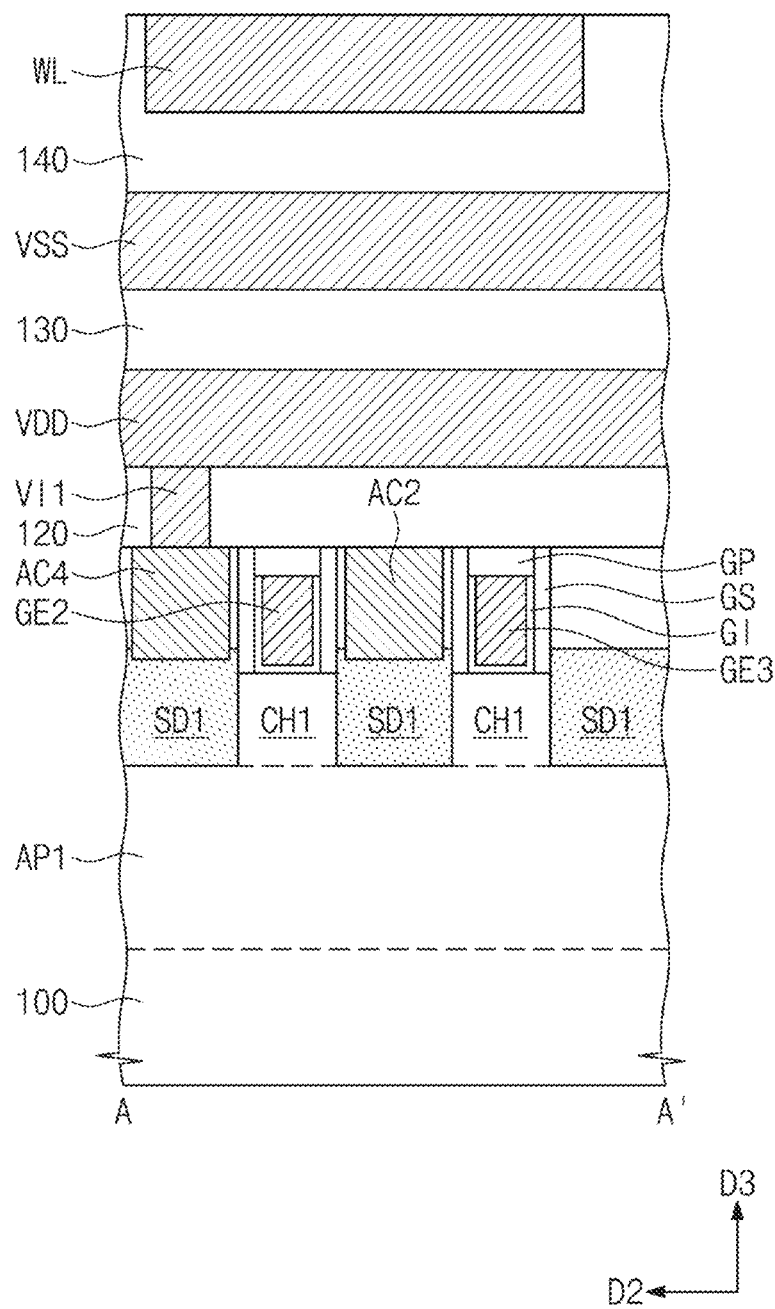
FIGS. 6A to 6D illustrate examples of cross-sectional views respectively taken along lines A-A', B-B', C-C', and D-D' of FIG. 5.
Figure 6B:
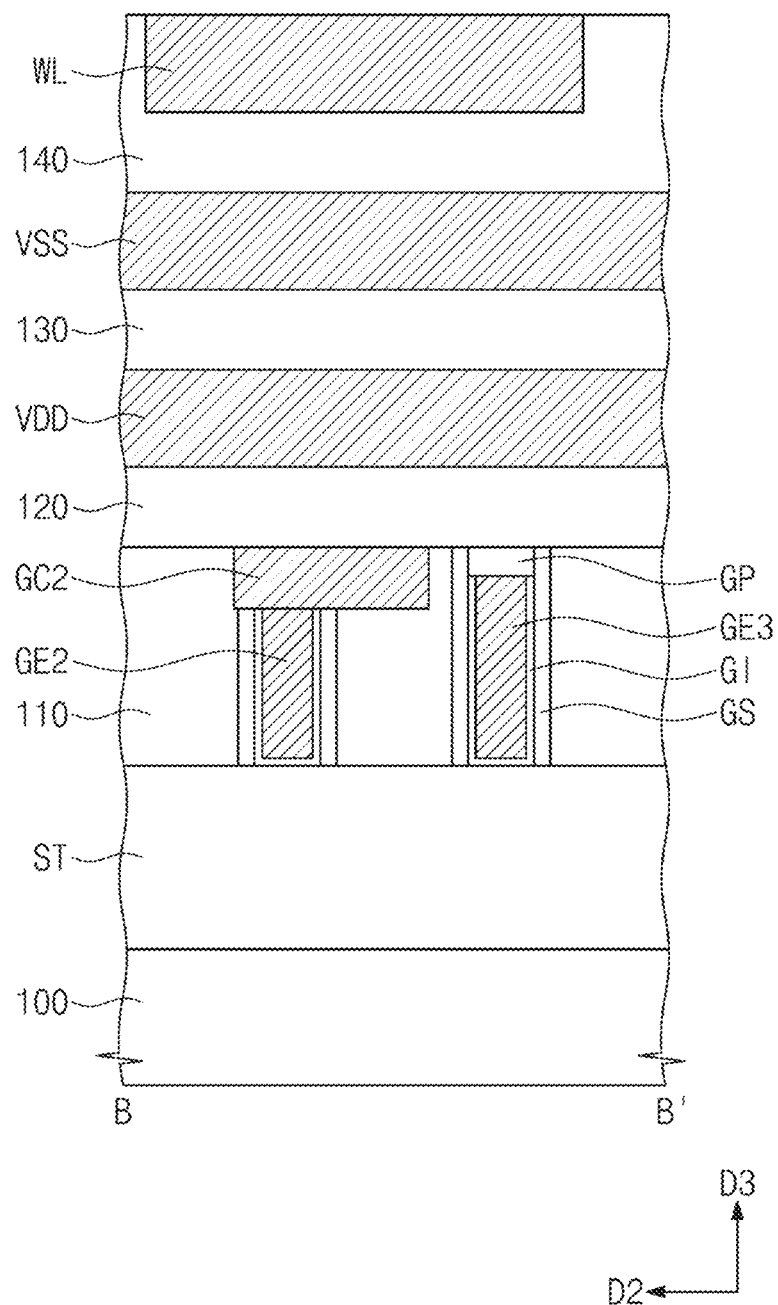
Figure 6C:
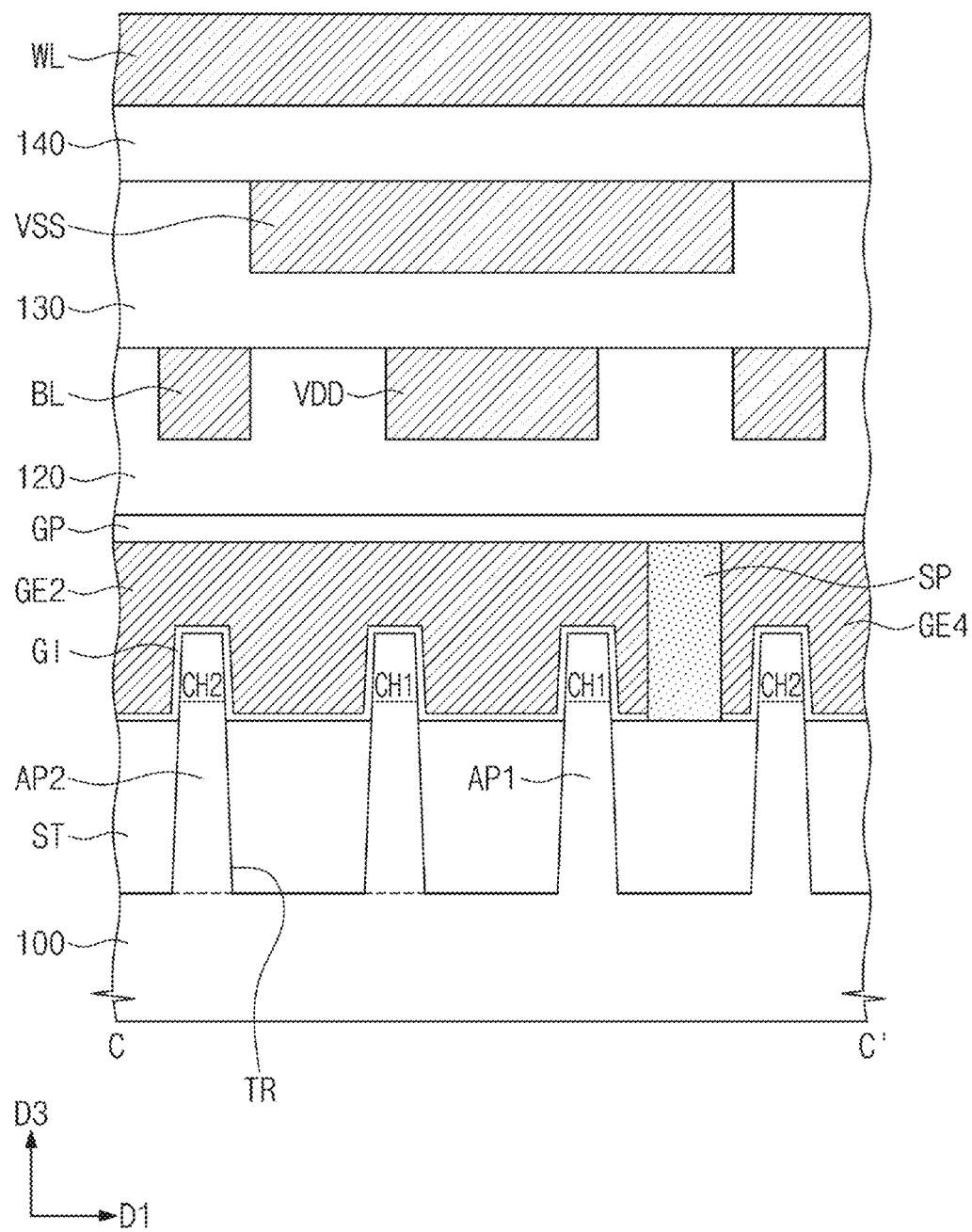
Figure 6D:
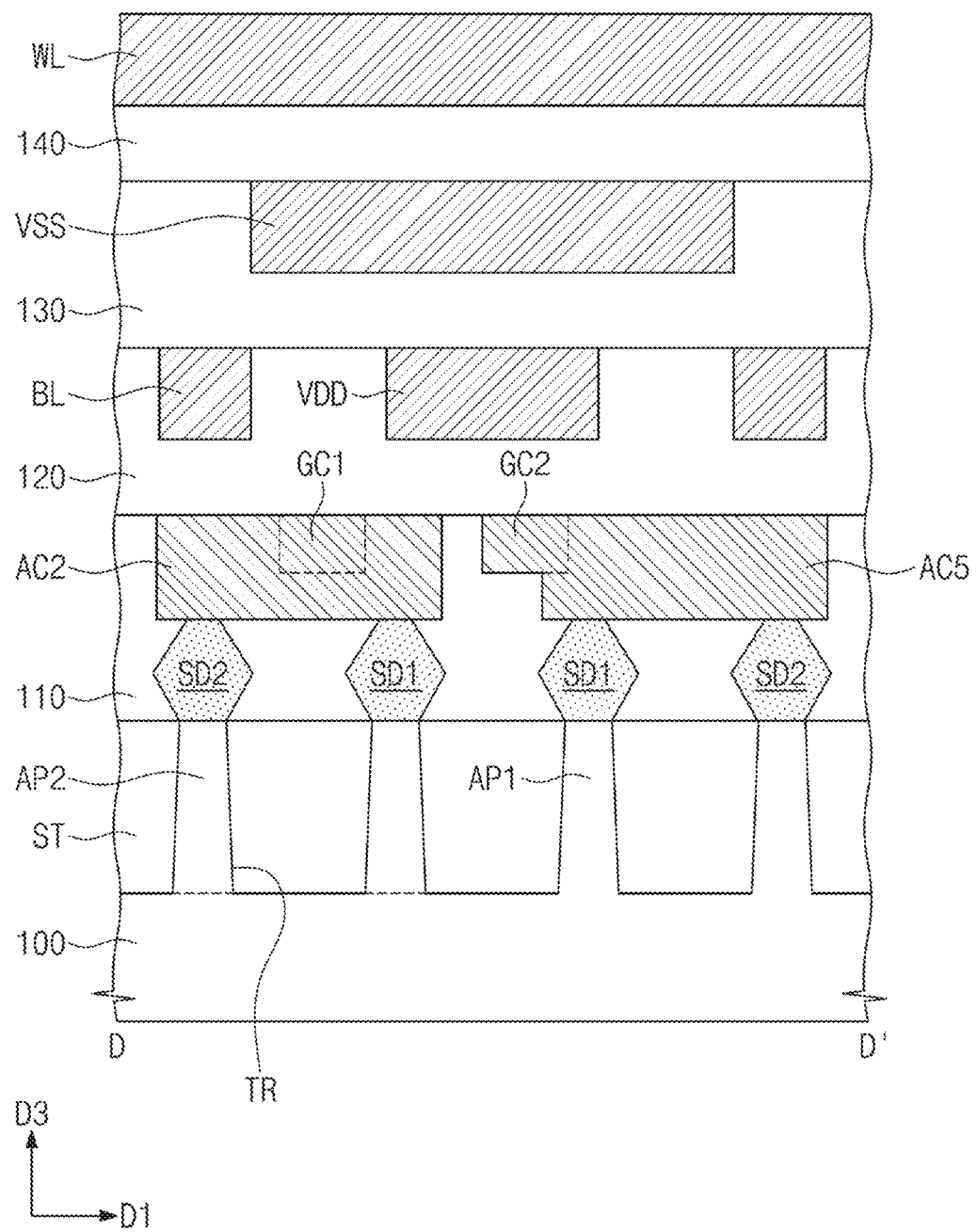

FIG. 5 illustrates an enlarged plan view of an example section N depicted in FIG. 3, showing an example SRAM cell according to the circuit diagram of FIG. 1. FIGS. 6A to 6D illustrate cross-sectional views respectively taken along lines A-A', B-B', C-C', and D-D' of FIG. 5.

In some example embodiments such as shown in FIGS. 1 to 5 and/or 6A to 6D, a substrate 100 may be provided thereon with the memory cell CE, which may include an SRAM cell. A device isolation layer ST may be provided on the substrate 100. The device isolation layer ST may define first and second active patterns AP1 and AP2. The substrate 100 may be a compound semiconductor substrate or a semiconductor substrate including silicon, germanium, silicon-germanium, or the like. The device isolation layer ST may include a dielectric material, such as a silicon oxide layer.

In some example embodiments, a first active pattern AP1 and/or a second active pattern AP2 may be portions of the substrate 100. A trench TR may be defined between neighboring first and second active patterns AP1 and AP2. The device isolation layer ST may fill the trench TR. The first active pattern AP1 and/or the second active pattern AP2 may have an upper portion that vertically protrudes beyond the device isolation layer ST. An upper portions of a first active pattern AP1 and/or a second active pattern AP2 may have a fin shape that vertically protrudes above the device isolation layer ST.

In some example embodiments, a first channel CH1 and/or a first source/drain pattern SD1 may be provided on an upper portions of a first active patterns AP1. A second channel CH2 and/or a second source/drain pattern SD2 may be provided on an upper portions of a second active patterns AP2. The first source/drain patterns SD1 may be p-type impurity regions. The second source/drain patterns SD2 may be n-type impurity regions. One or more of the first channels CH1 may be interposed between a pair of the first source/drain patterns SD1. One or more of the second channels CH2 may be interposed between a pair of the second source/drain patterns SD2.

In some example embodiments, a first source/drain pattern SD1 and/or a second source/drain pattern SD2 may be epitaxial patterns formed by a selective epitaxial growth process. The first source/drain pattern SD1 and/or the second source/drain pattern SD2 may have a top surfaces at a higher level than a top surface of a first channel CH1 and/or a second channel CH2. A first source/drain pattern SD1 and/or a second source/drain pattern SD2 may include a semiconductor element, which may be the same as or different from that of the substrate 100. For example, the first source/drain pattern SD1 may include a semiconductor element with a lattice constant that is greater than a lattice constant of a semiconductor element of the substrate 100. The first source/drain patterns SD1 may therefore provide the first channels CH1 with a compressive stress. For example, the second source/drain patterns SD2 may include the same or similar semiconductor element as the semiconductor element of the substrate 100.

In some example embodiments, first to fourth gate electrodes GE1 to GE4 may extend in the first direction D1, while running across the first active pattern AP1 and/or the second active pattern AP2. At least one of first to fourth gate electrodes GE1 to GE4 may vertically overlap at least one of first and second channels CH1 and CH2. One or more of the first to fourth gate electrodes GE1 to GE4 may include one or more of conductive metal nitride (e.g., titanium nitride or tantalum nitride) and/or metal (e.g., titanium, tantalum, tungsten, copper, or aluminum).

In some example embodiments, a second gate electrode GE2 and the fourth gate electrode GE4 may be linearly aligned with each other in the first direction D1. A dielectric pattern SP may intervene between, and may separate from each other, the second gate electrode GE2 and the fourth gate electrode GE4. The first gate electrode GE1 and the third gate electrode GE3 may be linearly aligned with each other in the first direction D1. A dielectric pattern SP may intervene between, and may separate from each other, the first gate electrode GE1 and the third gate electrode GE3.

In some example embodiments, a pair of gate spacers GS may be disposed on opposite sidewalls of one or more of the first to fourth gate electrodes GE1 to GE4. The gate spacers GS may extend in the first direction D1 along the first to fourth gate electrodes GE1 to GE4. One or more of the gate spacers GS may have a top surface that is higher than a top surface of at least one of the first to fourth gate electrodes GE1 to GE4. A top surface of at least one of the gate spacers GS may be coplanar with a top surface of a first interlayer dielectric layer 110. One or more of the gate spacers GS may include one or more of $SiO_2$, SiCN, SiCON, and SiN. For example, one or more of the gate spacers GS may include multiple layers that, respectively, include $SiO_2$, SiCN, SiCON, and SiN. Some example embodiments may be limited to two or more of such compositions, while other example embodiments may include one or more other compositions.

In some example embodiments, at least one gate dielectric pattern GI may be interposed between at least one of first to fourth gate electrodes GE1 to GE4 and/or at least one of first and/or second active patterns AP1 and AP2. At least one of the gate dielectric patterns GI may extend along a bottom surface of a corresponding one of the first to fourth gate electrodes GE1 to GE4. At least one of the gate dielectric patterns GI may cover a top surface and/or opposite sidewalls of a corresponding one of the first and second channels CH1 and CH2. The gate dielectric patterns GI may include a high-k dielectric material. For example, the high-k dielectric material may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

Some example embodiments may include gate capping patterns GP correspondingly provided on the first to fourth gate electrodes GE1 to GE4. At least one of the gate capping patterns GP may extend in the first direction D1 along at least one of the first to fourth gate electrodes GE1 to GE4. At least one of the gate capping pattern GP may be interposed between a pair of the gate spacers GS. At least one of the gate capping patterns GP may include a material having an etch selectivity with respect to first, second, third, and/or fourth interlayer dielectric layers 110, 120, 130, and 140. In some example embodiments, the gate capping patterns GP may include one or more of SiON, SiCN, SiCON, and SiN. In some example embodiments, gate capping patterns GP may be limited to such compositions, while in other example embodiments, gate capping patterns GP may include one or more other compositions.

In some example embodiments, a first interlayer dielectric layer 110 may be provided on a substrate 100. The first interlayer dielectric layer 110 may cover at least one of the gate spacers GS and/or at least one of the first and second source/drain patterns SD1 and SD2. The first interlayer dielectric layer 110 may have a top surface that is substantially coplanar with a top surface of at least one of the gate capping patterns GP and/or a top surface of at least one of the gate spacers GS.

Some example embodiments may include first to eighth active contacts AC1 to AC8. At least one of the first to eighth active contacts AC1 to AC8 may penetrate an upper portion of the first interlayer dielectric layer 110 and/or may have connection to the first and/or second source/drain patterns SD1 and SD2. At least one of the first to eighth active contacts AC1 to AC8 may have a top surface that is coplanar with a top surface of the first interlayer dielectric layer 110. At least one of the first to eighth active contacts AC1 to AC8 may include one or more of conductive metal nitride (e.g., titanium nitride or tantalum nitride) and metal (e.g., titanium, tantalum, tungsten, copper, or aluminum). In some example embodiments, at least one of the active contact patterns AC1 to AC8 may be limited to such compositions, while in other example embodiments, at least one of the active capping patterns AC1 to AC8 may include one or more other compositions.

Some example embodiments may include a first gate contact GC1 provided on a third gate electrode GE3 and/or a second gate contact GG2 provided on a second gate electrode GE2. At least one of the first and second gate contacts GC1 and GC2 may penetrate an upper portion of the first interlayer dielectric layer 110, gate spacers GS, and/or a gate capping patterns GP. At least one of the first gate contact GC1 and the second gate contact GC2 may have a connection to a second gate electrode GE2 and/or a third gate electrode GE3. At least one of the first gate contact GC1 and the second gate contact GC2 may have a top surfaces that is coplanar with a top surface of the first interlayer dielectric layer 110. At least one of the first gate contact GC1 and the second gate contact GC2 may have a bottom surfaces that is higher than a bottom surface of at least one of the first to eighth active contacts AC1 to AC8. At least one of the first gate contact GC1 and the second gate contact GC2 may include one or more of conductive metal nitride (e.g., titanium nitride or tantalum nitride) and metal (e.g., titanium, tantalum, tungsten, copper, or aluminum). The first and/or second gate contacts GC1 and GC2 may include a same or similar material as that of a first to eighth active contacts AC1 to AC8. For example, the first gate contact GC1 and the second active contact AC2 may be integrally combined to constitute a single conductive structure. The second gate contact GC2 and the fifth active contact AC5 may be integrally combined into a single conductive structure.

Some example embodiments may include a first interlayer dielectric layer 110 including a second interlayer dielectric layer 120, a third interlayer dielectric layer 130, and/or a fourth interlayer dielectric layer 140 that are sequentially stacked. For example, the first to fourth interlayer dielectric layers 110 to 140 may include a silicon oxide layer.

Some example embodiments may include a first line layer M1 in the second interlayer dielectric layer 120. The first line layer M1 may include the first bit line BL1, the second bit line BL2, the power line VDD, the first lower landing pads LLP1, the second lower landing pads LLP2, and/or the first vias VI1.

In some example embodiments, a first bit line BL1 may be electrically connected through the first via VI1 to the third active contact AC3. The second bit line BL2 may be electrically connected to the first via VI1 to the seventh active contact AC7. The power line VDD may be electrically connected through the first vias VI1 to the fourth active contacts AC4 and/or the sixth active contact AC6.

In some example embodiments (although not shown), one LLP1a of the first lower landing pads LLP1 may be electrically connected to an eighth active contact AC8. Another LLP1b of the first lower landing pads LLP1 may be electrically connected to the first active contact AC1. The fourth gate electrode GE4 may be electrically connected to one LLP2c of the second lower landing pads. The first gate electrode GE1 may be electrically connected to another LLP2d of the second lower landing pads LLP2 (e.g., as shown in FIG. 3).

Some example embodiments may include a second line layer M2 in the third interlayer dielectric layer 130. The second line layer M2 may include the ground line VSS, the upper landing pads ULP, and/or the second vias VI2.

In some example embodiments, a ground line VSS may be electrically connected through at least one VI2a of the second vias VI2 to the first lower landing pad LLP1a. The ground line VSS may be electrically connected through another VI2b of the second vias VI2 to the first lower landing pad LLP1b. One of the upper landing pads ULP may be electrically connected through another VI2c of the second vias VI2 to the second lower landing pad LLP2c. Another of the upper landing pads ULP may be electrically connected through another VI2d of the second vias VI2 to the second lower landing pad LLP2d (see FIG. 3). For example, the first active contact AC1 and/or the eighth active contact AC8 may be electrically connected to the ground line VSS of the second line layer M2.

Some example embodiments may include a third line layer M3 in the fourth interlayer dielectric layer 140. The third line layer M3 may include word lines WL and/or third vias VI3. The upper landing pads ULP may be electrically connected through the third vias VI3 to the word line WL. For example, the first gate electrode GE1 and the fourth gate electrode GE4 may be electrically connected to the word line WL.

In some example embodiments, memory transistors may include the first active patter AP1, the second active pattern AP2, and/or at least one of the first to fourth gate electrodes GE1 to GE4. The memory transistors of FIG. 5 may include a first pull-up transistor TU1, a first pull-down transistor TD1, a second pull-up transistor TU2, a second pull-down transistor TD2, a first access transistor TA1, and/or a second access transistor TA2, such as shown in the example of FIG. 1.

In some example embodiments, a first gate electrode GE1 may be a gate of the first access transistor TA1. The first gate electrode GE1 may be electrically connected to the word line WL. The second gate electrode GE2 may be a common gate of a first pull-up transistor TU1 and a first pull-down transistor TD1. The third gate electrode GE3 may be a common gate of a second pull-up transistor TU2 and a second pull-down transistor TD2. The fourth gate electrode GE4 may be a gate of the second access transistor TA2. The fourth gate electrode GE4 may be electrically connected to the word line WL.

In some example embodiments, a first active contact AC1 may be electrically connected to the second source/drain of the first pull-down transistor TD1. The first active contact AC1 may be electrically connected to the ground line VSS.

In some example embodiments, a second active contact AC2 may be electrically connected to a common source/drain (or the first source/drain) of a first pull-down transistor TD1 and an access transistor TA1. The second active contact AC2 may extend in the first direction D1. The second active contact AC2 may have electrical connection to the first source/drain of the first pull-up transistor TU1. The second contact AC2 may correspond to the first node N1 of FIG. 1.

In some example embodiments, a third active contact AC3 may be electrically connected to the second source/drain of the first access transistor TA1. The third active contact AC3 may be electrically connected through the first via VI1 to the first bit line BL1.

In some example embodiments, a fourth active contact AC4 may be electrically connected to the second source/drain of the first pull-up transistor TU1. The fourth active contact AC4 may be electrically connected through the first via VI1 to the power line VDD.

In some example embodiments, a fifth active contact AC5 may be electrically connected to the first source/drain of the second pull-up transistor TU2. The fifth active contact AC5 may extend in the first direction D1 and have electrical connection to a common source/drain (or the first source/drain) of the second pull-down and access transistors TD2 and TA2. The fifth active contact AC5 may correspond to the second node N2 of FIG. 1.

In some example embodiments, a sixth active contact AC6 may be electrically connected to the second source/drain of the second pull-up transistor TU2. The sixth active contact AC6 may be electrically connected through the first via VI1 to the power line VDD.

In some example embodiments, a seventh active contact AC7 may be electrically connected to the second source/drain of the second access transistor TA2. The third active contact AC3 may be electrically connected through the first via VI1 to the second bit line BL2.

In some example embodiments, an eighth active contact AC8 may be electrically connected to the second source/drain of the second pull-down transistor TD2. The eighth active contact AC8 may be electrically connected to the ground line VSS.

In some example embodiments, a first gate contact GC1 may be electrically connect the second active contact AC2 to the third gate electrode GE3. For example, the first gate contact GC1 may electrically connect the first node N1 of FIG. 1 to a common gate of the second pull-up transistor TU2 and a pull-down transistor TD2.

In some example embodiments, a second gate contact GC2 may electrically connect the fifth active contact AC5 to the second gate electrode GE2. For example, the second gate contact GC2 may electrically connect the second node N2 of FIG. 1 to the common gate of the first pull-up transistor TU1 and the pull-down transistor TD1.

In some example embodiments of some inventive concepts, a ground line VSS may include a mesh-typed conductive structure. The upper landing pads ULP may have an area that is smaller than an area of the ground line VSS. For example, the second line layer M2 may have an area that is greater than an area of the ground line VSS, which may, in some example embodiments, reduce the resistance the ground line VSS. In some example embodiments, word lines WL may be provided on the third line layer M3 on the second line layer M2, such that the word lines WL have a greater area than the area of the third line layer M3. Accordingly, the word lines WL may decrease in resistance. In some example embodiments, a reduced resistance of a ground line VSS and/or a word line WL may increase an operating speed of a semiconductor memory device according to some inventive concepts.

Figure 7:
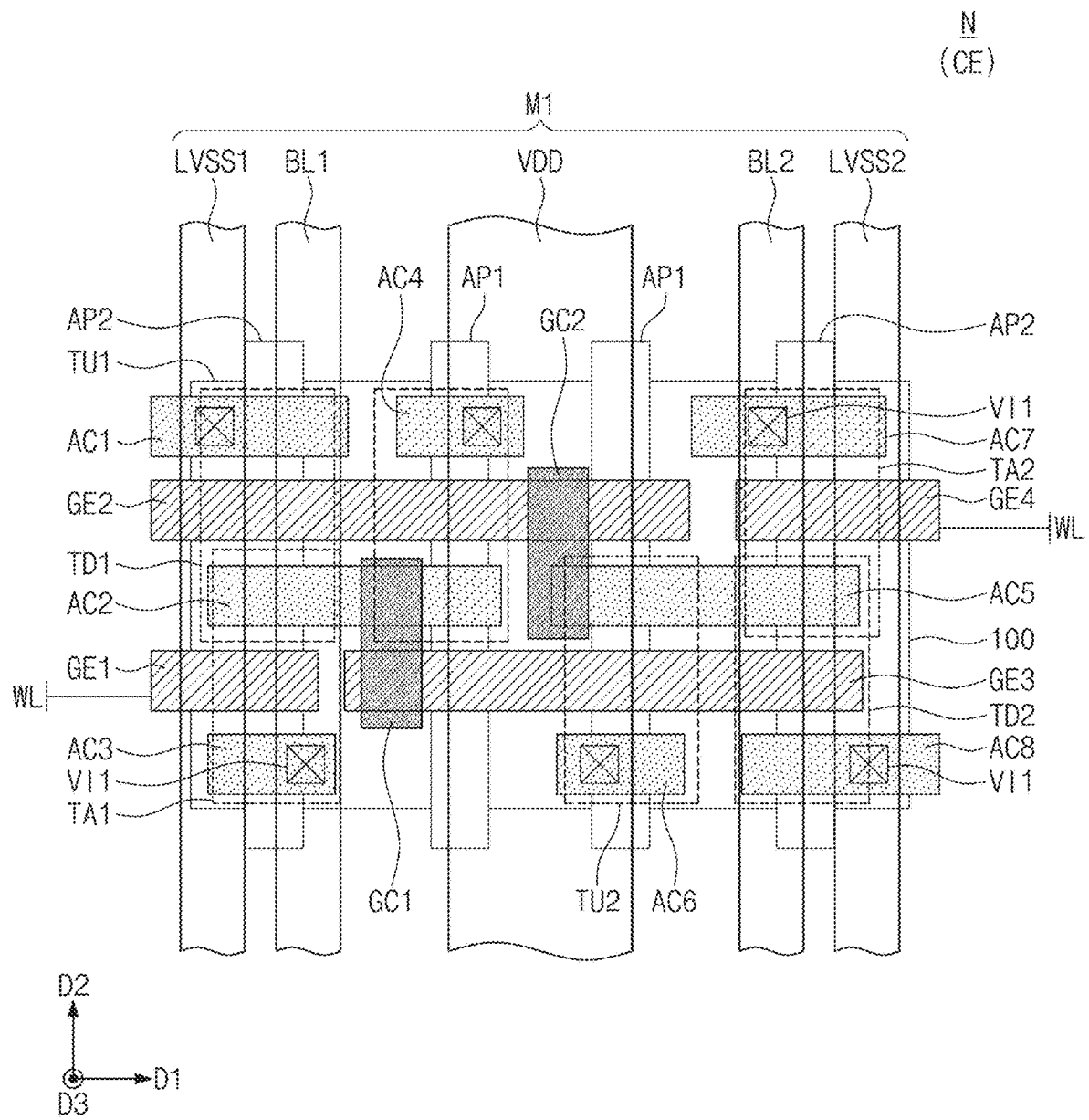
FIG. 7 illustrates a plan view of an example of section M depicted in FIG. 3, including an example semiconductor memory device according to some example embodiments of some inventive concepts.
Figure 8:
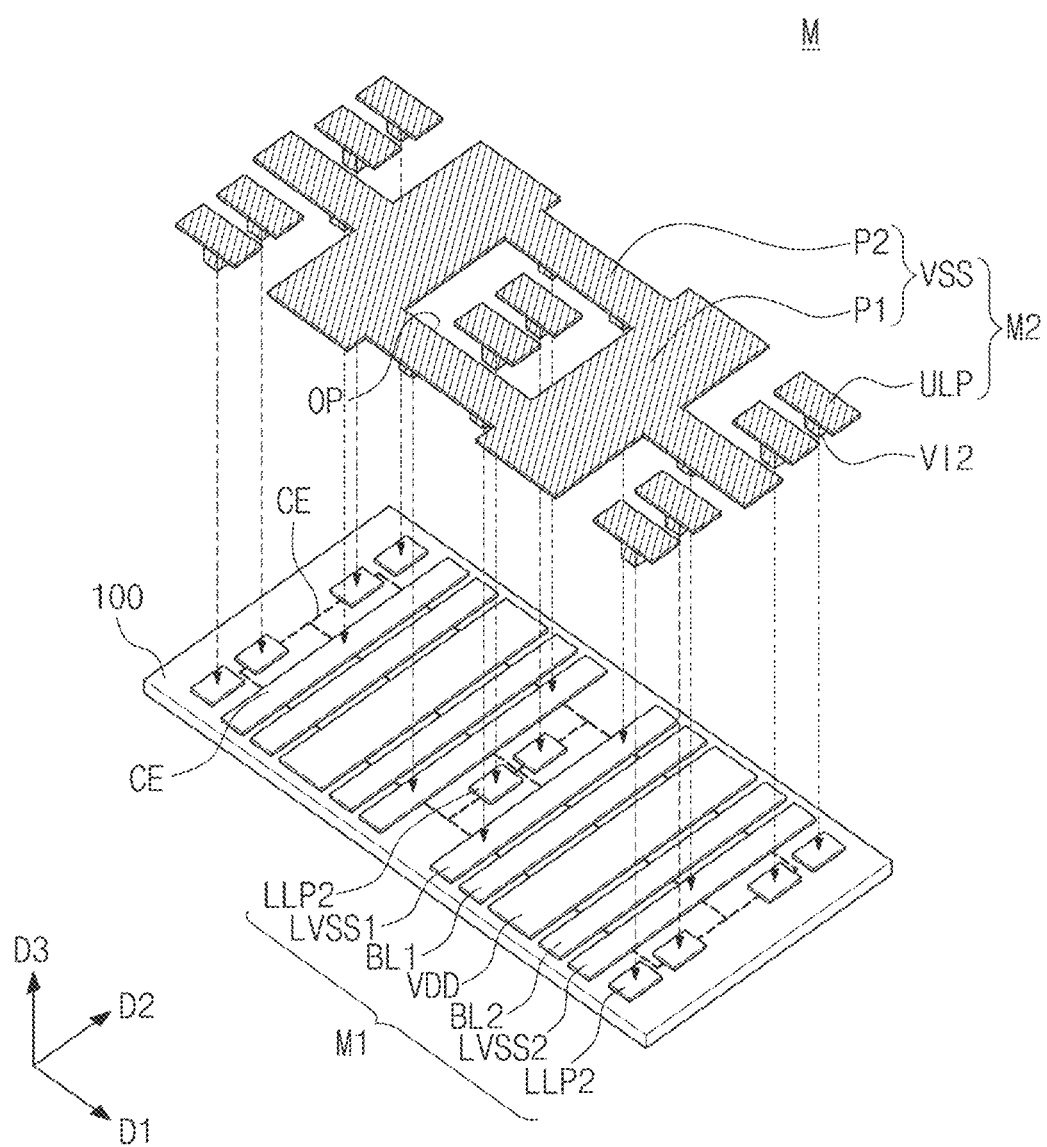
FIG. 8 illustrates a simplified perspective view including an example of line layers of section M depicted in FIG. 2.

FIG. 7 illustrates a plan view of an example of section M depicted in FIG. 3, showing an example semiconductor memory device according to some example embodiments of some inventive concepts. FIG. 8 illustrates a simplified perspective view showing an example of line layers of an example section M such as depicted in FIG. 2. In example embodiments such as shown in FIG. 7 and/FIG. 8, a detailed description of technical features that may be repetitive to those discussed above with reference to FIGS. 1 to 5 and 6A to 6D may be omitted.

In some example embodiments such as shown in FIGS. 7 and 8, a first line layer M1 may include a first lower ground line LVSS1 and a second lower ground line LVSS2. The first line layer M1 may include no first lower landing pads LLP1.

In some example embodiments, first and/or second lower ground lines LVSS1 and LVSS2 may extend in the second direction D2. The first and second lower ground lines LVSS1 and LVSS2 may have a linear shape. For example, the first and second lower ground lines LVSS1 and LVSS2 may run across a single memory cell CE. The first lower ground line LVSS1 may be adjacent to the first bit line BL1, and the second lower ground line LVSS2 may be adjacent to the second bit line BL2.

In some example embodiments, a first lower ground line LVSS1 may be electrically connected through the first via VI1 to the first active contact AC1. The second lower ground line LVSS2 may be electrically connected through the first via VI1 to the eighth active contact AC8. The first and second lower ground lines LVSS1 and LVSS2 may be connected in common to the ground line VSS of the second line layer M2.

Figure 9:
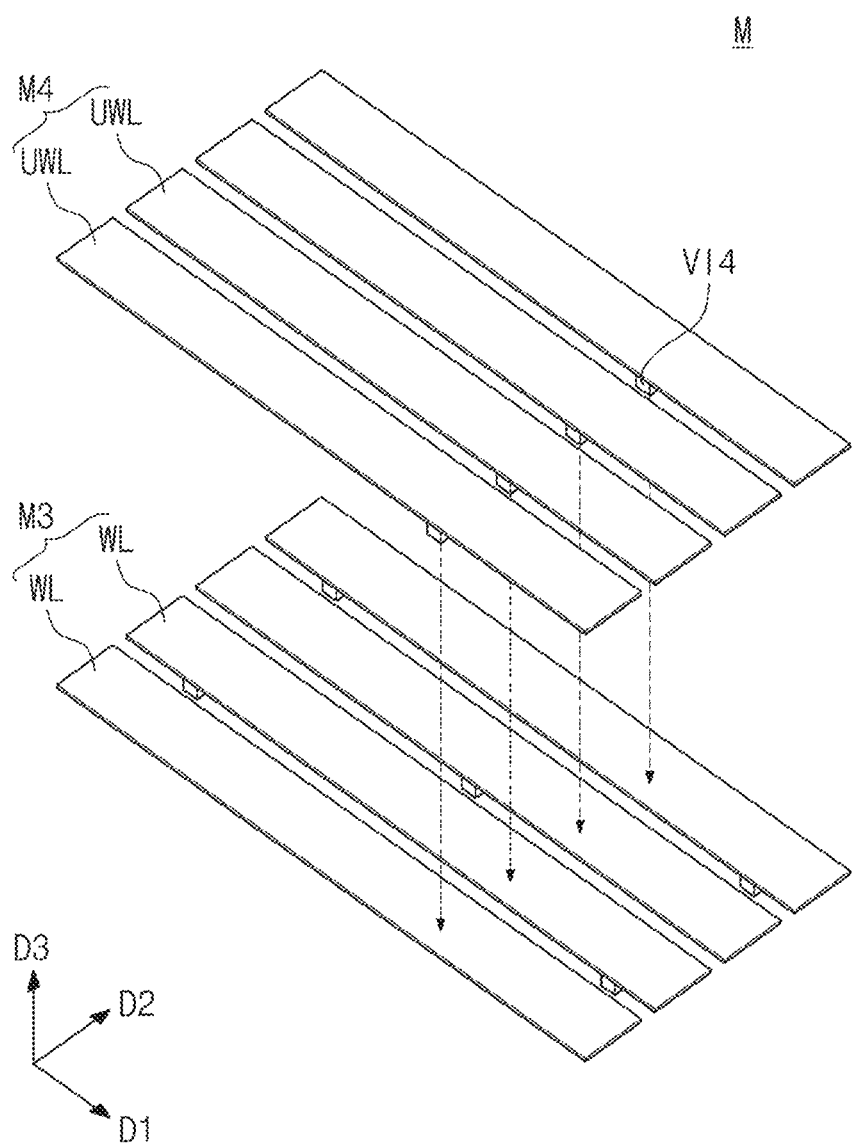
FIG. 9 illustrates a simplified perspective view of an example of section M depicted in FIG. 2, including an example semiconductor memory device according to some example embodiments of some inventive concepts.

FIG. 9 illustrates a simplified perspective view of section M depicted in FIG. 2, showing an example semiconductor memory device according to some example embodiments of some inventive concepts. In an example embodiment that follows, a detailed description of technical features that may be repetitive to those discussed above with reference to FIGS. 1 to 5 and 6A to 6D will be omitted.

Some example embodiments, such as shown in FIG. 9, may include a fourth line layer M4 provided on the third line layer M3. The fourth line layer M4 may include upper word lines UWL extending in the first direction D1. The upper word lines UWL may be arranged in the second direction D2. The upper word lines UWL may have a linear shape when viewed in plan.

In some example embodiments, at least one of the upper word lines UWL may vertically overlap, respectively, at least one of the word lines WL of the third line layer M3. At least one of the upper word lines UWL may be electrically connected through fourth vias VI4 to at least one of the word lines WL therebelow. The word line WL and/or an overlying upper word line UWL may function as a strap structure. In some example embodiments, an electrical signal may be applied through not only the word line WL but also the upper word line UWL, which may enable a decrease resistance and/or an increase in operating speed.

In some example embodiments of some inventive concepts, a semiconductor memory device may include a ground line having an area that is greater than an area of a second line layer. In some example embodiments, at least one word line may have an area that is greater than an area of a third line layer. Accordingly, the ground line and/or the word lines may decrease in resistance. Consequently, the semiconductor memory device may increase in operating speed.

Some example embodiments discussed herein refer to one or more transistors, such as pull-up transistors TU1, TU2, pull-down transistors TD1, TD2, and access transistors TA1, and TA2. Some example embodiments discussed herein refer to one or more terminals of such transistors, such as a drain, gate, and/or source. As used herein, such as in the discussion of some example embodiments and/or in the accompanying drawings, the term "transistor" may refer to a field-effect transistor, a binary junction transistor, and/or the like. As used herein, such as in the discussion of some example embodiments and/or in the accompanying drawings, the term "terminal" in the context of a transistor may refer to, for example, a drain, gate, source, collector, base, and/or emitter of the transistor or the like. Some example embodiments such as discussed herein and/or in the accompanying drawings may involve a drain, gate, source, or the like. It is to be appreciated that in some other example embodiments, whether or not discussed herein, the drain, gate, source, or the like may be substituted with a different terminal of the same or a different transistor without necessarily departing from the present disclosure, the scope of which is to be determined by the claims.

Although some example embodiments of some inventive concepts have been discussed with reference to the accompanying figures, various changes in form and details may be made therein without departing from the spirit and scope of some inventive concepts. Some example embodiments described above are just illustrative but not limitative in all aspects.

What is claimed is:

1. A semiconductor memory device, comprising:
a plurality of memory cells on a substrate, each of the plurality of memory cells including an access transistor and a pull-down transistor;
a first line layer on the memory cells, the first line layer including a power line, a first lower landing pad, and a second lower landing pad;
a second line layer on the first line layer, the second line layer including a ground line having an opening and an upper landing pad in the opening, the opening surrounding the upper landing pad when viewed in a plan view, the ground line including a pair of first segments and a pair of second segments that define the opening, each of the first segments extending in a second direction and having a first width in a first direction intersecting the second direction, each of the second segments extending in the first direction and having a second width in the second direction, the first width being greater than the second width; and
a third line layer including a word line on the second line layer,
wherein the ground line is electrically connected through the first lower landing pad to a terminal of the pull-down transistor, and
wherein the word line is electrically connected through the upper landing pad and the second lower landing pad to a terminal of the access transistor,
wherein the power line vertically overlaps a corresponding one of the first segments, and
wherein a via between the first lower landing pad and a corresponding one of the second segments is spaced apart from the corresponding one of the first segments.

2. The semiconductor memory device of claim 1, wherein the first line layer further includes a bit line, and
the bit line and the power line extend parallel to each other in the first direction.

3. The semiconductor memory device of claim 2, wherein the first lower landing pad and the second lower landing pad are adjacent to the bit line, and
the first lower landing pad and the second lower landing pad are arranged in the first direction.

4. The semiconductor memory device of claim 1, wherein at least a portion of the upper landing pad vertically overlaps the second lower landing pad.

5. The semiconductor memory device of claim 1, wherein the upper landing pad includes a pair of upper landing pads in the opening.

6. The semiconductor memory device of claim 1, wherein the ground line has a plurality of openings, and
the ground line is a mesh-typed conductive structure.

7. The semiconductor memory device of claim 1, further comprising:
a fourth line layer including an upper word line on the third line layer,
wherein the word line and the upper word line are electrically connected to each other.

8. A semiconductor memory device, comprising:
a plurality of memory cell transistors on a substrate;
a first line layer on the memory cell transistors; and
a second line layer on the first line layer,
wherein the first line layer includes a bit line, a power line, a first lower landing pad, and a second lower landing pad,
wherein the second line layer includes a ground line having a plurality of openings,
wherein the ground line includes a pair of first segments that extend in a second direction and a pair of second segments that extend in a first direction intersecting the second direction,
wherein each of the openings is defined by the pair of first segments and the pair of second segments,
wherein a width in the first direction of each first segment of the pair of first segments is greater than a width in the second direction of each second segment of the pair of second segments,
wherein the second line layer further includes a via between the first lower landing pad and a corresponding one of the second segments,
wherein the ground line has electrical connection through the via and the first lower landing pad to a terminal of a first memory transistor of the memory cell transistors,
wherein the power line vertically overlaps a corresponding one of the first segments, and
wherein the via is spaced apart from the corresponding one of the first segments.

9. The semiconductor memory device of claim 8, wherein the semiconductor memory device includes a third line layer on the second line layer, and the third line layer includes a word line that is electrically connected through an upper landing pad, which is included in the second line layer and provided in a corresponding one of openings, and the second lower landing pad to a terminal of a second memory transistor of the memory cell transistors.

10. The semiconductor memory device of claim 8, wherein the first lower landing pad is a lower ground line, the bit line, the power line, and the lower ground line extend parallel to each other, and the ground line is electrically connected through the lower ground line to the terminal of the first memory transistor.

11. A semiconductor memory device, comprising:

a plurality of memory cells on a substrate, each of the memory cells including a plurality of memory transistors; and a first line layer, a second line layer, and a third line layer sequentially stacked on the memory cells, wherein the first line layer includes a bit line, a power line, and a first lower landing pad, wherein the second line layer includes a ground line having an opening and an upper landing pad in the opening, the ground line including a pair of first segments and a pair of second segments that define the opening, each of the first segments extending in a second direction and having a first width in a first direction intersecting the second direction, each of the second segments extending in the first direction and having a second width in the second direction, the first width being greater than the second width, wherein the opening surrounds the upper landing pad when viewed in a plan view, wherein the third line layer includes a word line, wherein the word line is electrically connected through the upper landing pad and the first lower landing pad to a terminal of a first memory transistor of the memory transistors, wherein the power line vertically overlaps a corresponding one of the first segments, and wherein a via between the first lower landing pad and a corresponding one of the second segments is spaced apart from the corresponding one of the first segments.

12. The semiconductor memory device of claim 11, wherein the first line layer includes a second lower landing pad, and the ground line is electrically connected through the second lower landing pad to a terminal of a second memory transistor of the memory transistors.

13. The semiconductor memory device of claim 11, wherein the first line layer includes a lower ground line, and the ground line is electrically connected through the lower ground line to a terminal of a second memory transistor of the memory transistors.

14. The semiconductor memory device of claim 11, wherein the first memory transistor is an access transistor of a static random access memory (SRAM) cell.

* * * * *